United States Patent
Tajic et al.

(10) Patent No.: US 10,608,611 B2
(45) Date of Patent: Mar. 31, 2020

(54) BULK ACOUSTIC WAVE RESONATOR WITH ELECTRICALLY ISOLATED BORDER RING

(71) Applicant: Qorvo US, Inc., Greensboro, NC (US)

(72) Inventors: Alireza Tajic, Winter Springs, FL (US); Paul Stokes, Orlando, FL (US)

(73) Assignee: Qorvo US, Inc., Greensboro, NC (US)

( * ) Notice: Subject to any disclaimer, the term of this patent is extended or adjusted under 35 U.S.C. 154(b) by 130 days.

(21) Appl. No.: 15/279,579

(22) Filed: Sep. 29, 2016

(65) Prior Publication Data

US 2017/0264267 A1  Sep. 14, 2017

Related U.S. Application Data

(60) Provisional application No. 62/306,136, filed on Mar. 10, 2016, provisional application No. 62/312,291, filed on Mar. 23, 2016.

(51) Int. Cl.
*H03H 9/13* (2006.01)
*H03H 9/17* (2006.01)
(Continued)

(52) U.S. Cl.
CPC .............. *H03H 9/131* (2013.01); *H03H 3/02* (2013.01); *H03H 9/02086* (2013.01);
(Continued)

(58) Field of Classification Search
CPC .. H03H 9/02086; H03H 9/0211; H03H 9/131; H03H 9/171; H03H 9/173;
(Continued)

(56) References Cited

U.S. PATENT DOCUMENTS 7,649,304 B2 * 1/2010 Umeda .................... H03H 3/04
                                                310/312
8,008,993 B2 * 8/2011 Milsom ................ H03H 9/0211
                                                310/312
(Continued)

FOREIGN PATENT DOCUMENTS

JP  2005-159402 A  *  6/2005

OTHER PUBLICATIONS

T. Pensala et al.; "Spurious Resonance Suppression in Gigahertz-Range ZnO Thin-Film Bulk Acoustic Wave Resonators by the Boundary Frame Method: Modeling and Experiment"; IEEE Transactions on Ultrasonics, Ferroelectrics, and Frequency Control, vol. 56, No. 8, Aug. 2009, pp. 1731-1744.*

(Continued)

*Primary Examiner* — Barbara Summons
(74) *Attorney, Agent, or Firm* — Withrow & Terranova, P.L.L.C.

(57) ABSTRACT

A Bulk Acoustic Wave (BAW) resonator with an electrically isolated Border (BO) ring is provided. One BAW resonator includes a bottom electrode and a piezoelectric layer over the bottom electrode and having a top surface with a first portion and second portion about the first portion. The BAW resonator also includes a top electrode over the first portion of the piezoelectric layer and a BO ring including a non-conductive portion that is over the second portion of the piezoelectric layer and adjacent to the piezoelectric layer. The BAW resonator may be a Solidly Mounted BAW (SMR-BAW) resonator or a Film BAW Resonator (FBAR). A radio frequency filter including a ladder configuration with the above BAW resonator as a series BAW resonator and methods for fabricating the above BAW resonator are also provided.

22 Claims, 17 Drawing Sheets

(51) Int. Cl.
*H03H 9/60* (2006.01)
*H03H 9/02* (2006.01)
*H03H 3/02* (2006.01)

(52) U.S. Cl.
CPC .............. *H03H 9/13* (2013.01); *H03H 9/171* (2013.01); *H03H 9/173* (2013.01); *H03H 9/175* (2013.01); *H03H 9/605* (2013.01)

(58) Field of Classification Search
CPC .......... H03H 9/174; H03H 9/175; H03H 9/54; H03H 9/568; H03H 9/587; H03H 9/588; H03H 9/589; H03H 9/605; H03H 3/02; H03H 2003/021; H03H 2003/023; H03H 2003/025; H03H 9/13
USPC .................................................. 333/187, 189
See application file for complete search history.

(56) References Cited

U.S. PATENT DOCUMENTS

| | | | |
|---|---|---|---|
| 2008/0051039 A1* | 2/2008 | Iwasaki | H03H 9/173 455/73 |
| 2008/0179995 A1* | 7/2008 | Umeda | H03H 9/02086 310/324 |
| 2009/0206706 A1* | 8/2009 | Iwaki | H03H 9/02118 310/365 |
| 2010/0134210 A1* | 6/2010 | Umeda | H03H 3/04 333/189 |
| 2012/0182090 A1* | 7/2012 | Pang | H03H 9/02086 333/187 |
| 2014/0111288 A1* | 4/2014 | Nikkel | H03H 9/02118 333/187 |
| 2014/0118088 A1* | 5/2014 | Burak | H03H 9/02118 333/187 |
| 2016/0164488 A1* | 6/2016 | Shin | H03H 9/173 333/187 |

OTHER PUBLICATIONS

Lee et al.; "Optimization of Frame-like Film Bulk Acoustic Resonators for Suppression of Spurious Lateral Modes Using Finite Element Method"; 2004 IEEE International Ultrasonics, Ferroelectrics, and Frequency Control Joint 50th Anniversary Conference, 2004, pp. 278-281. (Year: 2004).*

* cited by examiner

BULK ACOUSTIC WAVE RESONATOR WITH ELECTRICALLY ISOLATED BORDER RING

RELATED APPLICATIONS

This application claims the benefit of provisional patent application Ser. No. 62/306,136, filed Mar. 10, 2016 and provisional patent application Ser. No. 62/312,291, filed Mar. 23, 2016, the disclosures of which are hereby incorporated herein by reference in their entireties.

FIELD OF THE DISCLOSURE

The present disclosure relates to Bulk Acoustic Wave (BAW) resonators.

BACKGROUND

Acoustic resonators and, particularly, Bulk Acoustic Wave (BAW) resonators are used in many high-frequency, communication applications. In particular, BAW resonators are often employed in filter networks that operate at frequencies above 1.5 GHz and require a flat passband; have exceptionally steep filter skirts and squared shoulders at the upper and lower ends of the passband; and provide excellent rejection outside of the passband. BAW-based filters also have relatively low insertion loss, tend to decrease in size as the frequency of operation increases, and are relatively stable over wide temperature ranges. As such, BAW-based filters are the filter of choice for many 3rd Generation (3G) and 4th Generation (4G) wireless devices, and are destined to dominate filter applications for 5th Generation (5G) wireless devices. Most of these wireless devices support cellular, wireless fidelity (Wi-Fi), Bluetooth, and/or near field communications on the same wireless device, and as such, pose extremely challenging filtering demands. While these demands keep raising the complexity of the wireless devices, there is a constant need to improve the performance of BAW resonators and BAW-based filters as well as decrease the cost and size associated therewith.

SUMMARY

Various embodiments provide a Bulk Acoustic Wave (BAW) resonator with an electrically isolated Border (BO) ring is provided. A radio frequency (RF) filter having a ladder configuration with the above BAW resonator as a series BAW resonator and methods for fabricating the above BAW resonator are also provided.

One BAW resonator includes a bottom electrode and a piezoelectric layer over the bottom electrode and having a top surface with a first portion and second portion about the first portion. The BAW resonator also includes a top electrode over the first portion of the piezoelectric layer and a border (BO) ring including a non-conductive portion that is over the second portion of the piezoelectric layer and adjacent to the piezoelectric layer.

In various embodiments, the BO ring has a conductive portion over the non-conductive portion. In these embodiments, the conductive portion is electrically isolated from the top electrode. Furthermore, the BAW resonator resonates at a series resonant frequency ($f_s$) and has no BO mode below the series resonant frequency ($f_s$).

In some embodiments, the BAW resonator is a Solidly Mounted (SMR) BAW resonator. In other embodiments, the BAW resonator is a Film BAW Resonator (FBAR).

One RF filter comprises an input, an output, and at least one shunt BAW resonator coupled to the input and the output. The RF filter further comprises at least one series BAW resonator coupled to the shunt BAW resonator, the input, and the output in a ladder network configuration. In various embodiments, each series BAW resonator comprises a bottom electrode, a piezoelectric layer over the bottom electrode and having a top surface with a first portion and second portion about the first portion, a top electrode over the first portion of the piezoelectric layer, and a border ring comprising a non-conductive portion that is over the second portion of the piezoelectric layer and adjacent to the piezoelectric layer.

A method for fabricating a BAW resonator comprises forming a bottom electrode and forming a piezoelectric layer having a top surface with a first portion and second portion about the first portion over the bottom electrode. The method further comprises forming a top electrode over the first portion of the piezoelectric layer and forming a border (BO) ring having a non-conductive portion that is over the second portion of the piezoelectric layer and adjacent to the piezoelectric layer. In some embodiments, the method further comprises forming a conductive portion over the non-conductive portion of the BO ring, wherein the conductive portion is electrically isolated from the top electrode.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this Specification illustrate several aspects of the disclosure, and together with the description serve to explain the principles of the disclosure.

DETAILED DESCRIPTION

Figure 1:
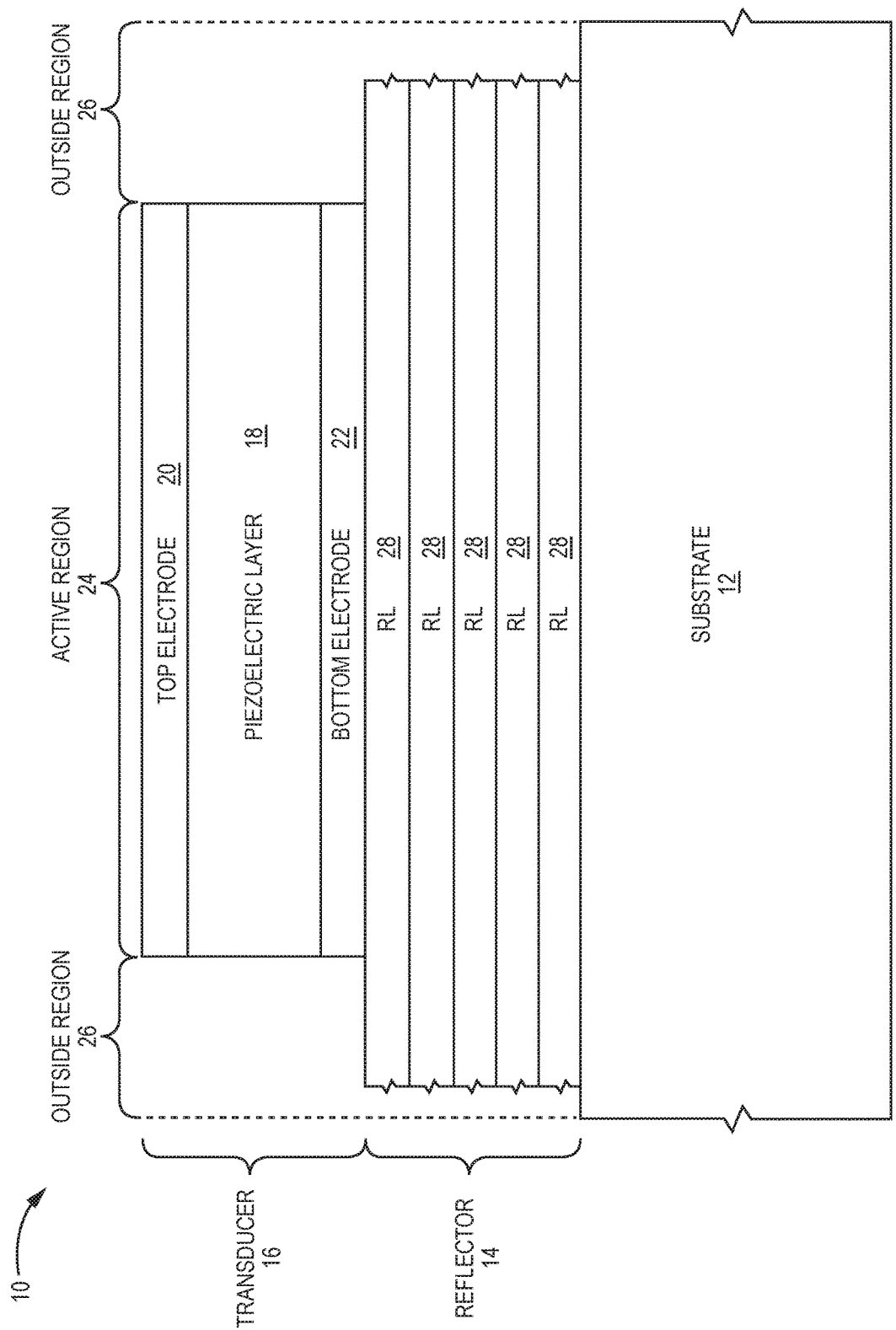
FIG. 1 is a diagram illustrating a conventional Bulk Acoustic Wave (BAW) resonator.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or "extending onto" another element, it can be directly on or extend directly onto the other element or intervening elements may also be present. In contrast, when an element is referred to as being "directly on" or "extending directly onto" another element, there are no intervening elements present. Likewise, it will be understood that when an element such as a layer, region, or substrate is referred to as being "over" or "extending over" another element, it can be directly over or extend directly over the other element or intervening elements may also be present. In contrast, when an element is referred to as being "directly over" or "extending directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Bulk Acoustic Wave (BAW) resonators are used in many high-frequency filter applications. An exemplary BAW resonator 10 is illustrated in FIG. 1. The BAW resonator 10 generally includes a substrate 12, a reflector 14 mounted over the substrate 12, and a transducer 16 mounted over the reflector 14. The transducer 16 rests on the reflector 14 and includes a piezoelectric layer 18, which is sandwiched between a top electrode 20 and a bottom electrode 22. The top and bottom electrodes 20 and 22 may be formed of Tungsten (W), Molybdenum (Mo), Aluminum Copper (AlCu), or like material, and the piezoelectric layer 18 may be formed of Aluminum Nitride (AlN), Zinc Oxide (ZnO) or other appropriate piezoelectric material. Although shown in FIG. 1 as each including a single layer, the top electrode 20, and/or the bottom electrode 22 may include multiple layers of the same material, multiple layers in which at least two layers are different materials, or multiple layers in which each layer is a different material.

The BAW resonator 10 is divided into an active region 24 and an outside region 26. The active region 24 generally corresponds to the section of the BAW resonator 10 where the top and bottom electrodes 20 and 22 overlap and also includes the layers below the overlapping top and bottom electrodes 20 and 22. The outside region 26 corresponds to the section of the BAW resonator 10 that surrounds the active region 24 and it is not electrically driven.

For the BAW resonator 10, applying electrical signals across the top electrode 20 and the bottom electrode 22 excites acoustic waves in the piezoelectric layer 18. These acoustic waves primarily propagate vertically. A primary goal in BAW resonator design is to confine these vertically-propagating acoustic waves in the transducer 16. Acoustic waves traveling upwardly are reflected back into the transducer 16 by the air-metal boundary at the top surface of the top electrode 20. Acoustic waves traveling downwardly are reflected back into the transducer 16 by the reflector 14, or by an air cavity, which is provided just below the transducer in a Film BAW Resonator (FBAR).

The reflector 14 is typically formed by a stack of reflector layers (RL) 28, which alternate in material composition to produce a significant reflection coefficient at the junction of adjacent reflector layers 28. Typically, the reflector layers 28 alternate between materials having high and low acoustic impedances, such as tungsten (W) and silicon dioxide ($SiO_2$). While only five reflector layers 28 are illustrated in FIG. 1, the number of reflector layers 28 and the structure of the reflector 14 will vary from one design to another.

Figure 2:
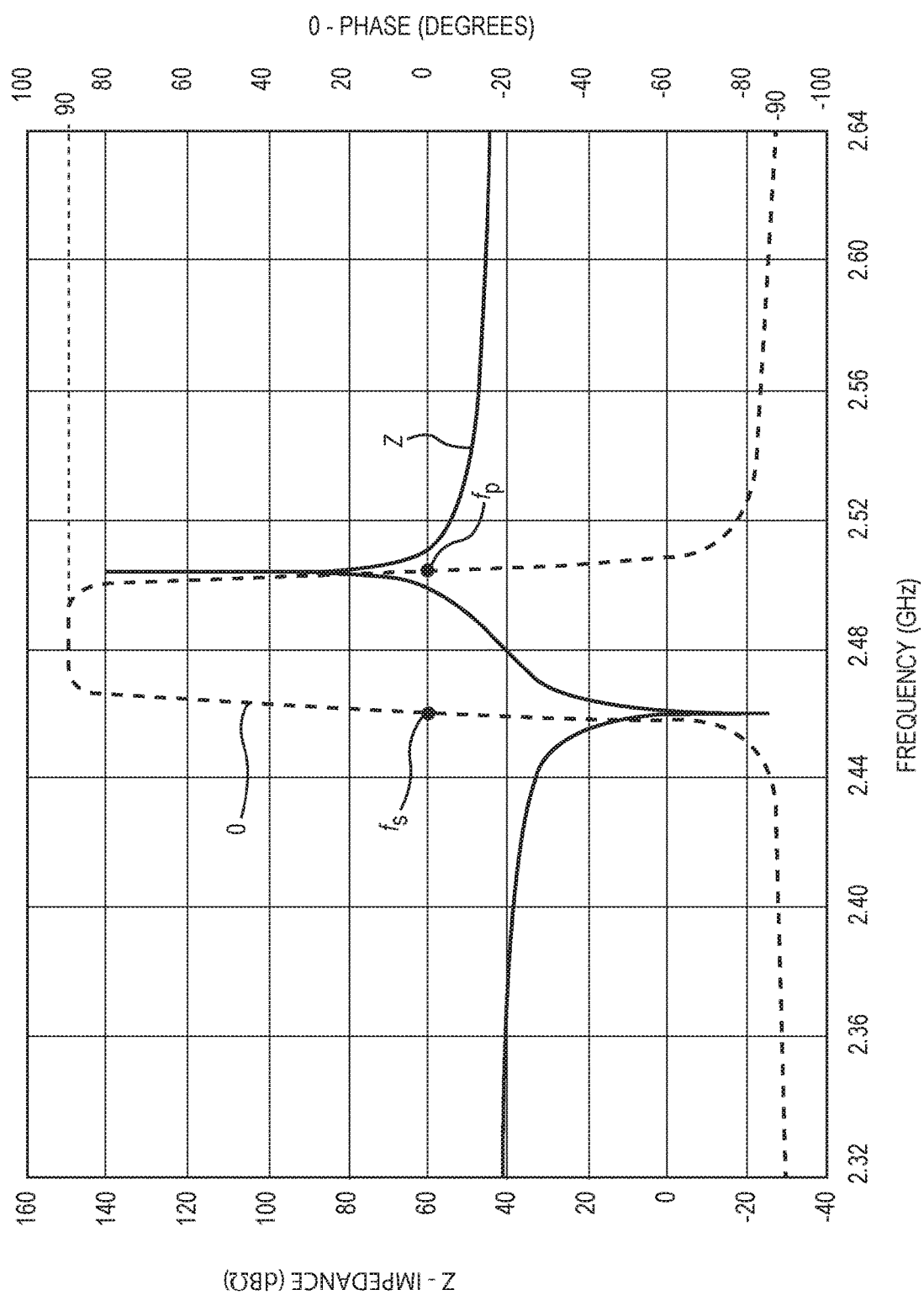
FIG. 2 is a diagram graphically illustrating the magnitude and phase of the electrical impedance as a function of the frequency for a relatively ideal BAW resonator.

The magnitude (Z) and phase ($\phi$) of the electrical impedance as a function of the frequency for a relatively ideal BAW resonator 10 is provided in FIG. 2. The magnitude (Z) of the electrical impedance is illustrated by the solid line, while the phase ($\phi$) of the electrical impedance is illustrated by the dashed line. A unique feature of the BAW resonator 10 is that it has both a resonance frequency and an anti-resonance frequency. The resonance frequency is typically referred to as the series resonance frequency ($f_s$), the anti-resonance frequency is typically referred to as the parallel resonance frequency ($f_p$). The series resonance frequency ($f_s$) occurs when the magnitude of the impedance, or reactance, of the BAW resonator 10 approaches zero. The parallel resonance frequency ($f_p$) occurs when the magnitude of the impedance, or reactance, of the BAW resonator 10 peaks at a significantly high level. In general, the series resonance frequency ($f_s$) is a function of the thickness of the piezoelectric layer 18 and the mass of the bottom and top electrodes 20 and 22.

For the phase, the BAW resonator 10 acts like an inductance that provides a 90° phase shift between the series resonance frequency ($f_s$) and the parallel resonance frequency ($f_p$). In contrast, the BAW resonator 10 acts like a capacitance that provides a −90° phase shift below the series resonance frequency ($f_s$) and above the parallel resonance frequency ($f_p$). The BAW resonator 10 presents a very low, near zero, resistance at the series resonance frequency ($f_s$), and a very high resistance at the parallel resonance frequency ($f_p$). The electrical nature of the BAW resonator 10 lends itself to the realization of a very high Q (quality factor) inductance over a relatively short range of frequencies, which has proven to be very beneficial in high frequency filter networks, especially those operating at frequencies around 1.8 GHz and above.

Figures 3A, 3B, 3C:
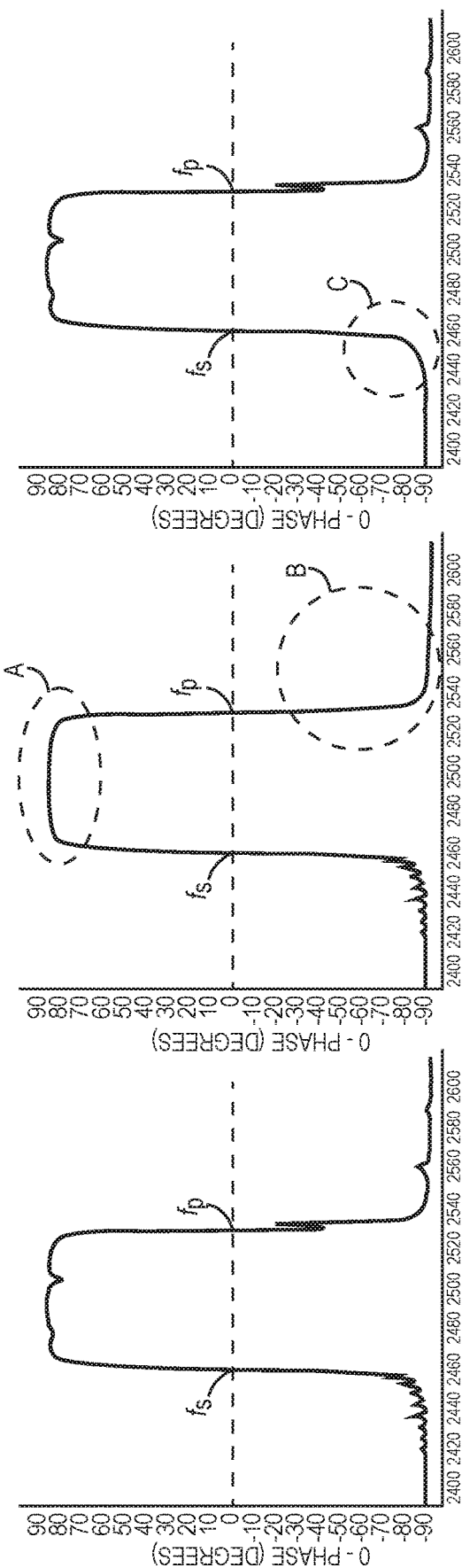
FIGS. 3A-3C are diagrams graphically illustrating the phase curves for various conventional BAW resonators.

Unfortunately, the phase (ϕ) curve of FIG. 2 is representative of an ideal phase curve. In reality, approaching this ideal is challenging. A typical phase curve for the BAW resonator 10 of FIG. 1 is illustrated in FIG. 3A. Instead of being a smooth curve, the phase curve of FIG. 3A includes ripple below the series resonance frequency ($f_s$), between the series resonance frequency ($f_s$) and the parallel resonance frequency ($f_p$), and above the parallel resonance frequency ($f_p$). The ripple is the result of spurious modes, which are caused by spurious resonances that occur in corresponding frequencies. While the vast majority of the acoustic waves in the BAW resonator 10 propagate vertically, various boundary conditions about the transducer 16 result in the propagation of lateral (horizontal) acoustic waves, which are referred to as lateral standing waves. The presence of these lateral standing waves reduces the potential Q associated with the BAW resonator 10.

Figure 4:
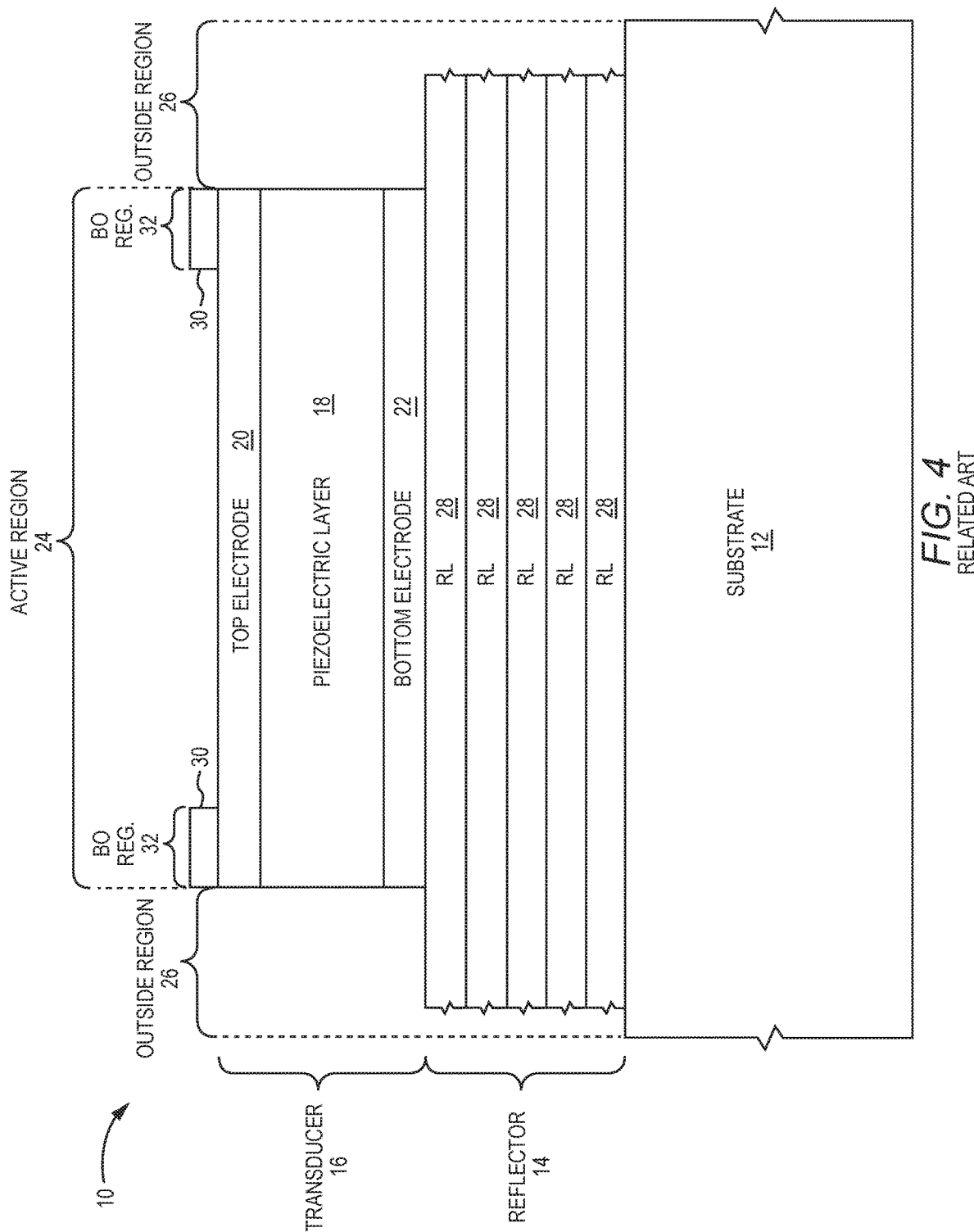
FIG. 4 is a diagram illustrating a conventional BAW resonator with a top electrode including a border (BO) ring.

As illustrated in FIG. 4, a border (BO) ring 30 is formed on or within the top electrode 20 to suppress certain of the spurious modes. The spurious modes that are suppressed by the BO ring 30 are those above the series resonance frequency ($f_s$), as highlighted by circles A and B in the phase curve of FIG. 3B. Circle A shows a suppression of the ripple, and thus the spurious mode, in the passband of the phase curve, which resides between the series resonance frequency ($f_s$) and the parallel resonance frequency ($f_p$). Circle B shows suppression of the ripple, and thus the spurious modes, above the parallel resonance frequency ($f_p$). Notably, the spurious mode in the upper shoulder of the passband, which is just below the parallel resonance frequency $f_p$, and the spurious modes above the passband are suppressed, as evidenced by the smooth or substantially ripple free phase curve between the series resonance frequency ($f_s$) and the parallel resonance frequency ($f_p$) and above the parallel resonance frequency ($f_p$).

The BO ring 30 corresponds to a mass loading of the portion of the top electrode 20 that extends about the periphery of the active region 24. The BO ring 30 may correspond to a thickened portion of the top electrode 20 or the application of additional layers of an appropriate material over the top electrode 20. The portion of the BAW resonator 10 that includes and resides below the BO ring 30 is referred to as a BO region 32. Accordingly, the BO region 32 corresponds to an outer, perimeter portion of the active region 24 and resides inside of the active region 24.

While the BO ring 30 is effective at suppressing spurious modes above the series resonance frequency ($f_s$), the BO ring 30 has little or no impact on those spurious modes below the series resonance frequency ($f_s$), as shown by the ripples in the phase curve below the series resonance frequency ($f_s$) in FIG. 3B. A technique referred to as apodization is often used to suppress the spurious modes that fall below the series resonance frequency ($f_s$).

Apodization tries to avoid, or at least significantly reduce, any lateral symmetry in the BAW resonator 10, or at least in the transducer 16 thereof. The lateral symmetry corresponds to the footprint of the transducer 16, and avoiding the lateral symmetry corresponds to avoiding symmetry associated with the sides of the footprint. For example, one may choose a footprint that corresponds to a pentagon instead of a square or rectangle. Avoiding symmetry helps reduce the presence of lateral standing waves in the transducer 16. Circle C of FIG. 3C illustrates the effect of apodization in which the spurious modes below the series resonance frequency ($f_s$) are suppressed, as evidence by the smooth or substantially ripple free phase curve below the series resonance frequency ($f_s$). Assuming no BO ring 30 is provided, one can readily see in FIG. 3C that apodization fails to suppress those spurious modes above the series resonant frequency ($f_s$). As such, the typical BAW resonator 10 employs both apodization and the BO ring 30.

Figure 5A:
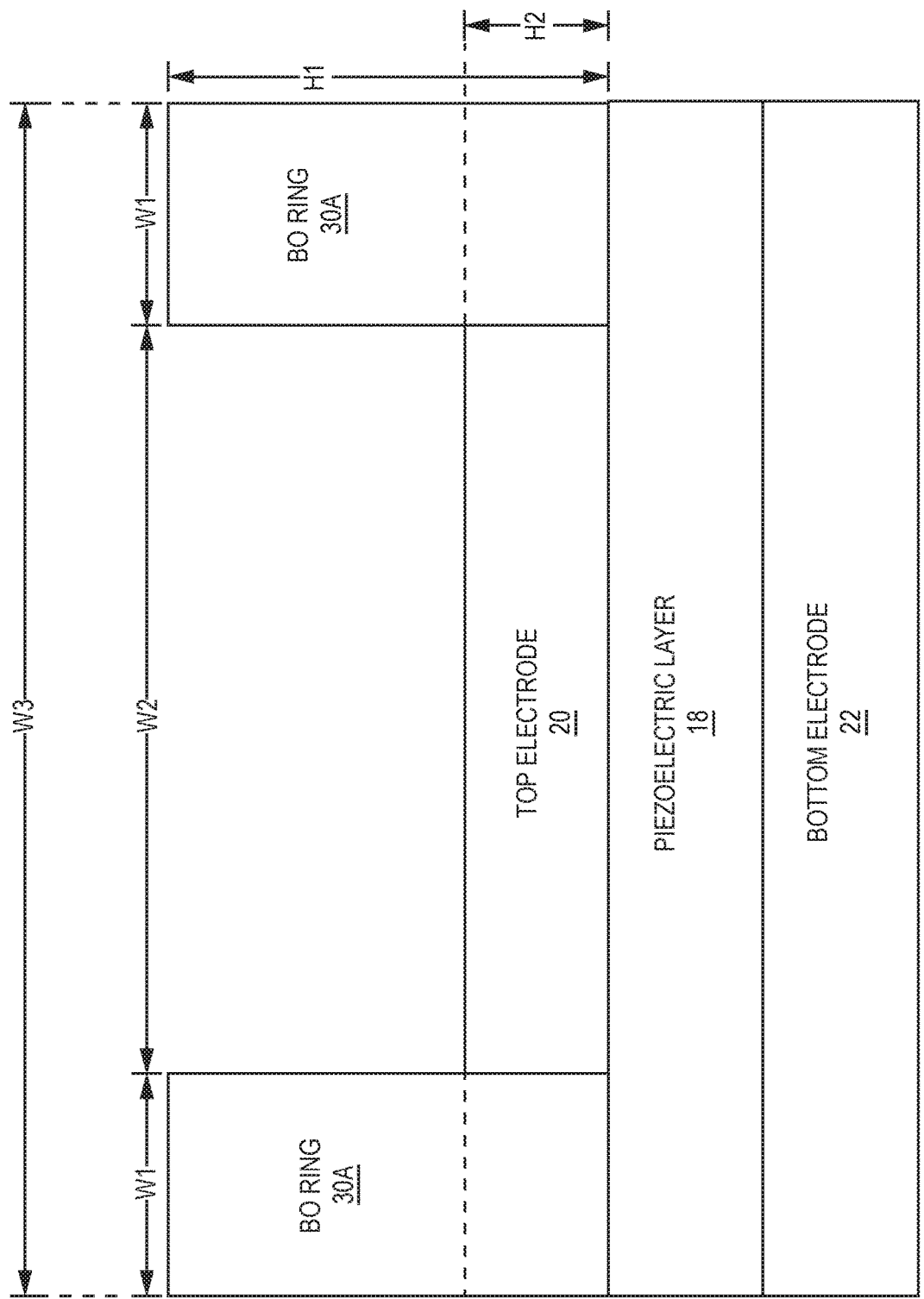
FIGS. 5A-5D are diagrams illustrating various embodiments of a BAW resonator with a border (BO) ring that is electrically isolated from the top electrode.

A supplement to or alternative for apodization is described below. With reference to FIG. 5A, a portion of a BAW resonator, such as BAW resonator 10, with a BO ring 30A that is electrically isolated from the top electrode 20 is illustrated.

In various embodiments, the BO ring 30A is formed on a portion of the piezoelectric layer 18 that is adjacent to and is about or surrounds the top electrode 20, which resides on an inner portion of the piezoelectric layer 18. The BO ring 30A, in some embodiments, is formed over a peripheral portion of the piezoelectric layer 18 and the top electrode 20 is over an inner portion of the piezoelectric layer 18. The terms "about" and "surrounds" are defined to require coverage of at least a majority of a periphery to accommodate electrical connections and any fabrication or implementation limitations associated with the respective elements.

The BO ring 30A has a thickness or height (H1) that is about 100 nm to about 150 nm greater than the thickness or height (H2) of the top electrode 20. The top electrode 20, in various embodiments, has a height (H2) in the range of about 100 nm to about 300 nm and thus, the BO ring 30A has a height (H1) in the range of about 200 nm to about 450 nm (e.g., (100 nm+100 nm=200 nm) to (300 nm+150 nm=450 nm)).

In some embodiments, the BO ring 30A has a width (W1) in the range of about 0.25 μm to about 10 μm. As such, the top electrode 20 has a width (W2) that will be narrower than the width (W3) of the bottom electrode 22 by about 0.5 μm to about 20 μm because the BO ring 30A surrounds the top electrode 20. Stated differently, the bottom electrode 22 will be about 0.5 μm to about 20 μm wider than the top electrode 20.

The width (W1) and the height (H1) of the BO ring 30A, in various embodiments, comprise an inverse relationship with respect to one another. That is, as the width (W1) of the BO ring 30A increases, the height (H1) of the BO ring 30A decreases and vice-versa. As such, the width (W1) and the height (H1) of the BO ring 30A can be changed relative to one another to optimize suppression of spurious modes above the resonance frequency fs.

In various embodiments, the BO ring 30A and the piezoelectric layer 18 include different materials or the same material. Suitable materials for the BO ring 30A and the piezoelectric layer 18 include, but are not limited to aluminum nitride (AlN), silicon dioxide ($SiO_2$), silicon nitride (SiN), and the like materials.

In one embodiment, the BO ring 30A is a $SiO_2$ mass loading layer deposited on an AlN piezoelectric layer such that the BO ring 30A is about or surrounds an AlCu/W top electrode 20. As further illustrated in FIG. 5A, the BO ring 30A is taller than the top electrode 20 and has a width (W1) of 4 µm. The BO ring 30A, has a height (H1) of about 270 nm and the top electrode 20 has a height (H2) in the range of about 120 nm to about 170 nm, which is about 100 nm to about 150 nm thinner/shorter than the BO ring 30A.

In another embodiment, the BO ring 30A is an AlN mass loading layer deposited on an AlN piezoelectric layer such that the BO ring 30A is about or surrounds an AlCu/W top electrode 20. As further illustrated in FIG. 5A, the BO ring 30A is taller than the top electrode 20 and has a width (W1) of 2 µm. The BO ring 30A, has a height (H1) of about 335 nm and the top electrode 20 has a height (H2) in the range of about 185 nm to about 235 nm, which is about 100 nm to about 150 nm thinner/shorter than the BO ring 30A.

Figure 5B:
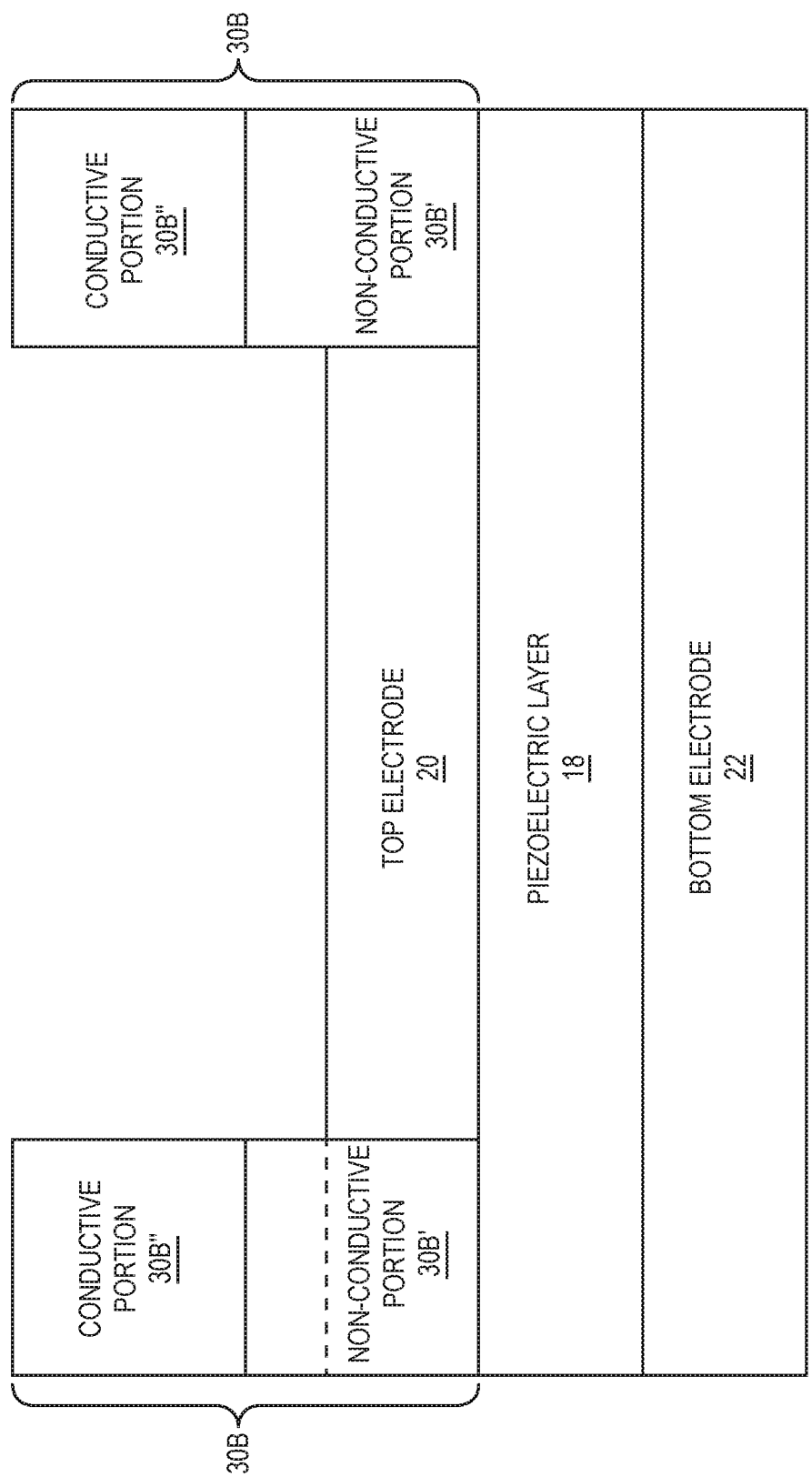

With reference now to FIG. 5B, FIG. 5B is a diagram illustrating another embodiment of a BO ring 30B that is electrically isolated from the top electrode 20. In various embodiments, the BO ring 30B is formed on a portion of the piezoelectric layer 18 that is adjacent to and is about or surrounds the top electrode 20, which resides on an inner portion of the piezoelectric layer 18. The BO ring 30B, in some embodiments, is formed over a peripheral portion of the piezoelectric layer 18 and the top electrode 20 is over an inner portion of the piezoelectric layer 18.

The BO ring 30B in FIG. 5B has a non-conductive portion 30B' of AlN, $SiO_2$, SiN, and the like materials and a conductive portion 30B" of AlCu, Tungsten (W), Molybdenum (Mo), Copper (Cu), and the like heavy metals. In various embodiments, the non-conductive portion 30B' and the piezoelectric layer 18 include the same material and the conductive portion 30B" and the top electrode 20 include the same material.

The non-conductive portion 30B' is thicker or includes a greater height than the top electrode 20. The non-conductive portion 30B' may be any amount taller than the top electrode 20 provided that the conductive portion 30B" is electrically isolated from the top electrode 20 or is grounded. In some embodiments, the conductive portion 30B" has a height in the range of about 10 nm to about 50 nm.

The width and thickness/height of the BO ring 30B and individually, the non-conductive portion 30B' and the conductive portion 30B", comprise an inverse relationship with respect to one another. That is, as the overall width of the BO ring 30B increases, the overall height of the BO ring 30B decreases and vice-versa provided that the conductive portion 30B" is electrically isolated from the top electrode 20. Specifically, the height of the non-conductive portion 30B' and/or the height of the conductive portion 30B" increases in relation to the width of the non-conductive portion 30B' and/or the height of the conductive portion 30B" decreasing and vice-versa provided that the conductive portion 30B" is electrically disconnected from the top electrode 20.

In one embodiment, the non-conductive portion 30B' is a $SiO_2$ mass loading layer deposited on an AlN piezoelectric layer such that the BO ring 30B is about or surrounds an AlCu/W top electrode 20. As further illustrated in FIG. 5B, the non-conductive portion 30B' is taller than the top electrode 20 and has a width (W1) of 4 µm and a height (H1) of 200 nm. The conductive portion 30B" has a height of 60 nm when formed of AlCu, a height of 10 nm when formed of Tungsten, a height of 20 nm when formed of Molybdenum, and a height of 20 nm when formed of Copper.

Figure 5C:
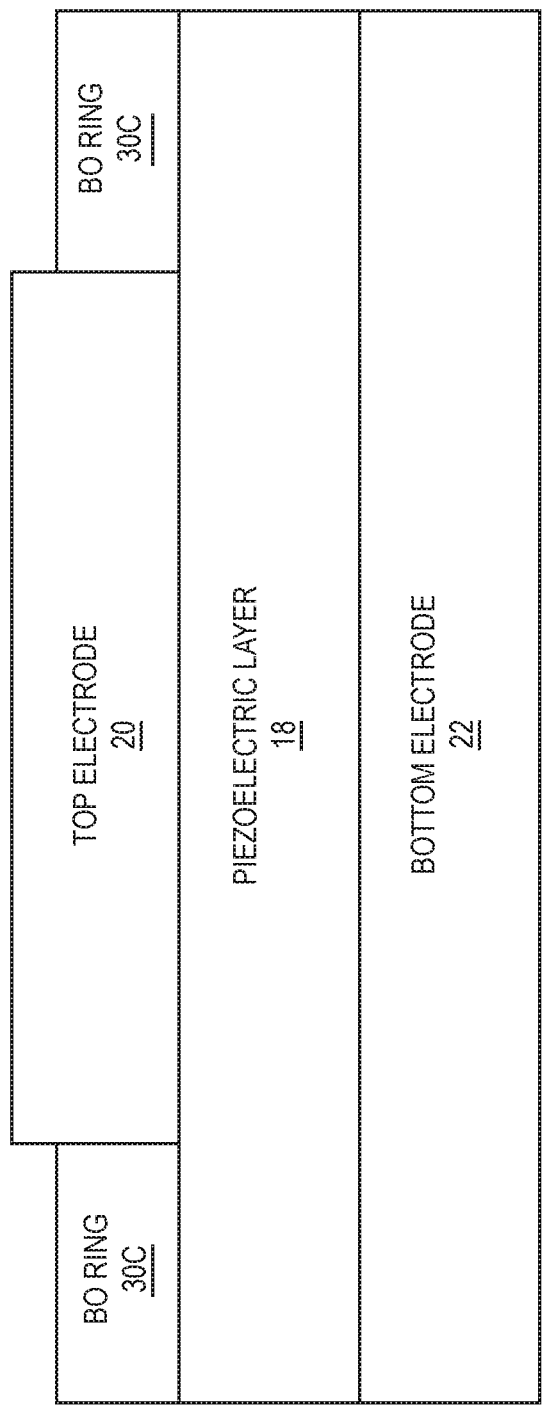

FIG. 5C is a diagram illustrating another embodiment of a BO ring 30C that is electrically isolated from the top electrode 20. In various embodiments, the BO ring 30C is formed on a portion of the piezoelectric layer 18 that is adjacent to and is about or surrounds the top electrode 20, which resides on an inner portion of the piezoelectric layer 18. The BO ring 30C, in some embodiments, is formed over a peripheral portion of the piezoelectric layer 18 and includes a different material than or the same material as the top electrode 20. The top electrode 20 is over an inner portion of the piezoelectric layer 18 and is taller than the BO ring 30C.

The height and width of the BO ring 30C are inversely proportional and adjustable similar to the embodiment discussed above with reference to FIG. 5A, except that the BO ring 30C in the embodiment discussed with reference to FIG. 5C is shorter than the top electrode 20.

Figure 5D:
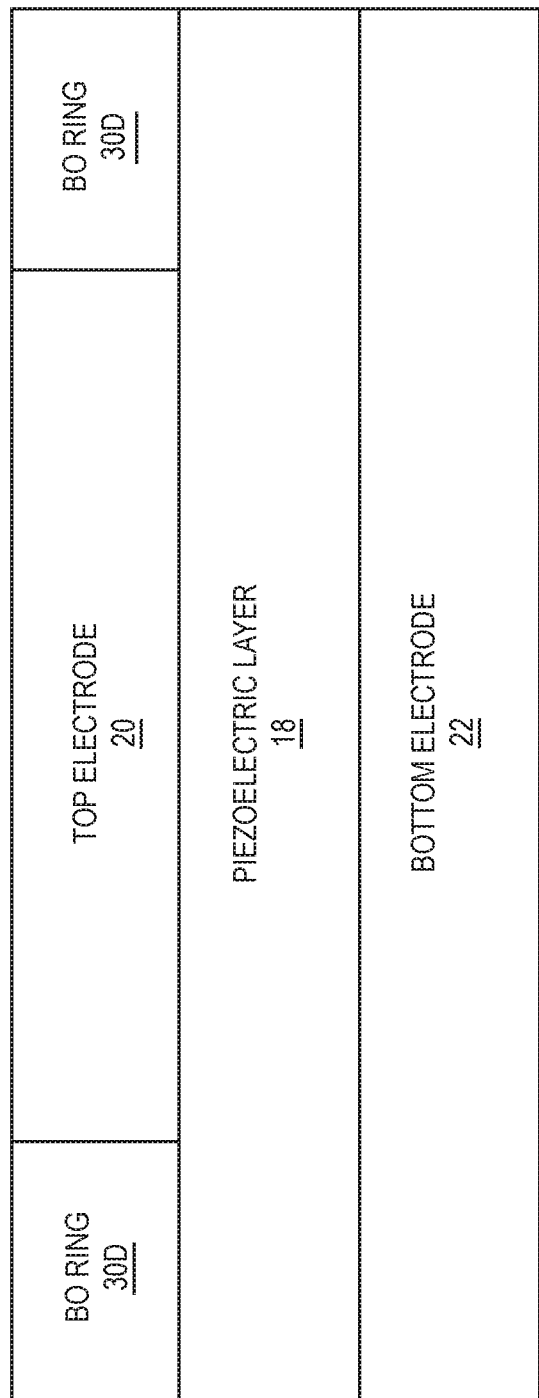

FIG. 5D is a diagram illustrating another embodiment of a BO ring 30D that is electrically isolated from the top electrode 20. In various embodiments, the BO ring 30D is formed on a portion of the piezoelectric layer 18 that is adjacent to and is about or surrounds the top electrode 20, which resides on an inner portion of the piezoelectric layer 18. The BO ring 30D, in some embodiments, is formed over a peripheral portion of the piezoelectric layer 18 and includes a different material than or the same material as the top electrode 20. The top electrode 20 is over an inner portion of the piezoelectric layer 18 and the top electrode 20 and the BO ring 30D are the same height.

Figure 6:
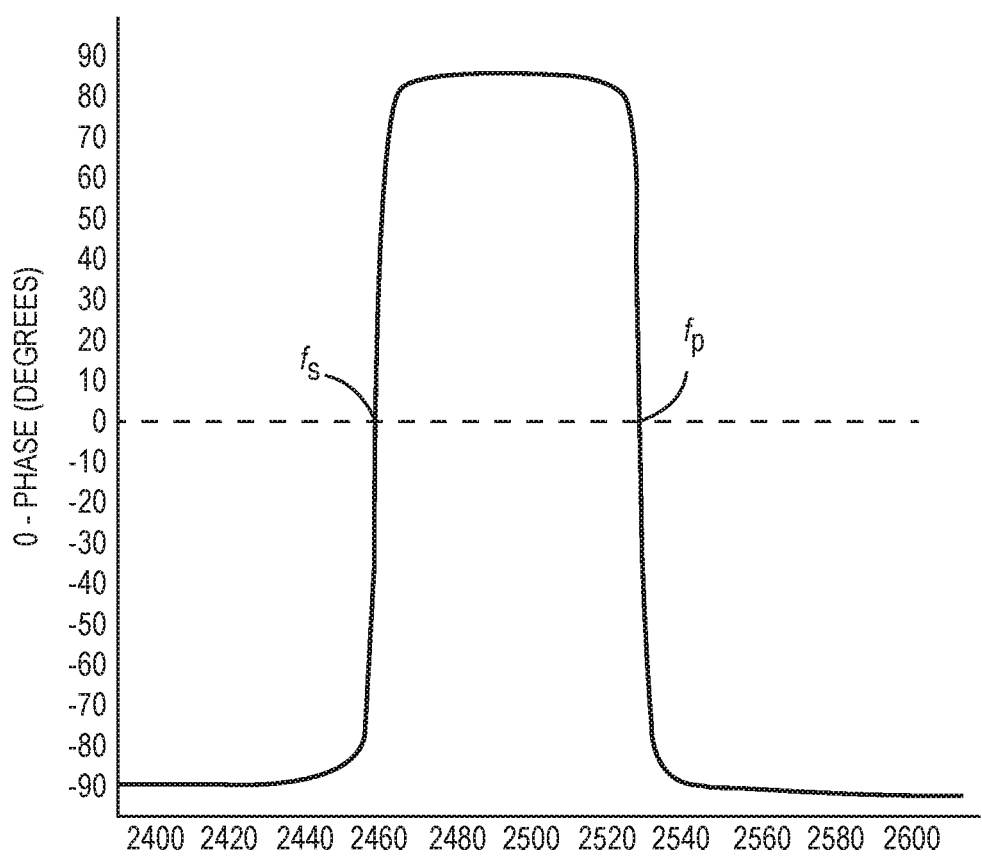
FIG. 6 is a diagram illustrating a phase curve for a BAW resonator comprising the electrically isolated BO rings discussed with reference to FIGS. 5A-5D.

FIG. 6 illustrates a phase curve for a BAW resonator 10 including the electrically isolated BO rings 30A-30D discussed with reference to FIGS. 5A-5D. Notably, electrically isolating the BO rings 30A-30D reduces the ripple throughout the phase curve, which is evidence of the spurious modes being suppressed. Thus, spurious modes are substantially or completely suppressed 1) the BO mode that may be below or above the series resonance frequency ($f_s$) depending on the frequency difference between the central part of the active region and the BO region, as well as the type of BO, namely mass loading or mass removal BO, 2) the mode between the series resonance frequency ($f_s$) and the parallel resonance frequency ($f_p$), and 3) the mode that is above the parallel resonance frequency ($f_p$), as evidenced by the smooth or substantially ripple free phase curve.

Figure 7:
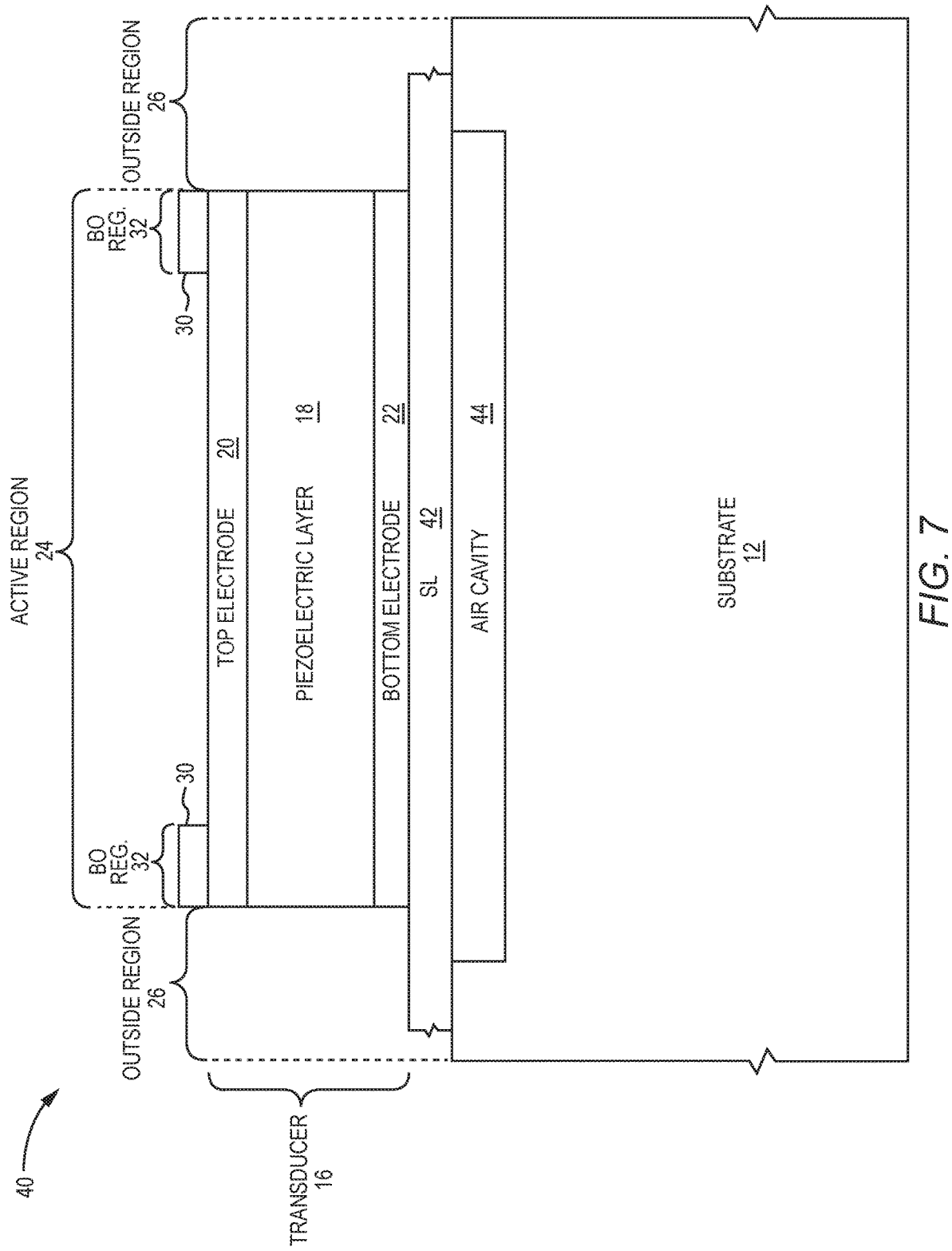
FIG. 7 is a diagram illustrating one embodiment of a Film BAW Resonator (FBAR) comprising the electrically isolated BO ring discussed with reference to FIG. 5A.

The various embodiments of the electrically isolated BO rings 30A-30D have been discussed with reference to a Solidly Mounted BAW (SMR-BAW) resonator; however, the electrically isolated BO rings 30A-30D are not limited to SMR-BAW resonators. That is, the various embodiments of the electrically isolated BO rings 30A-30D may be applied to a Film BAW Resonator (FBAR) 40 in which the electrically isolated BO rings 30A-30D and the top electrode 20 are formed laterally adjacent to one another over the piezoelectric layer 18, which is over the bottom electrode 22, are formed over a support layer (SL) 42 above an air cavity 44 in the substrate 12, as illustrated in FIG. 7, instead of over the reflector 14 in the BAW resonator 10. While FIG. 7 shows the embodiment of the electrically isolated BO ring 30A discussed with reference to FIG. 5A, the embodiments of the electrically isolated BO rings 30B through 30D discussed with reference to FIGS. 5B-5D may also form a portion of the FBAR 40 where the electrically isolated BO ring 30A is shown.

Figure 8A:
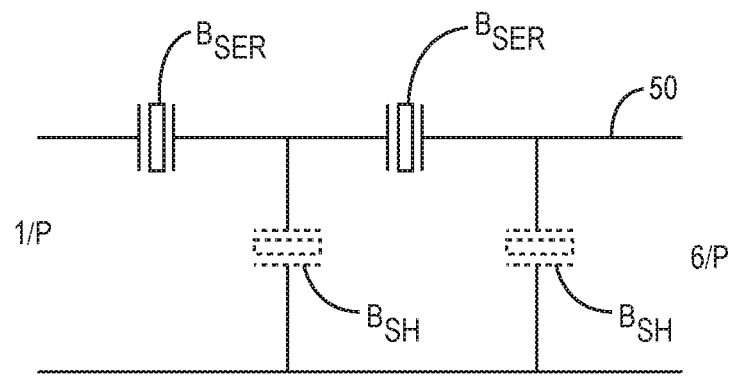
FIGS. 8A-8C are diagrams illustrating a ladder network utilizing a plurality of BAW resonators, a response for the ladder network, and a passband for the ladder network, respectively.
Figure 8B:
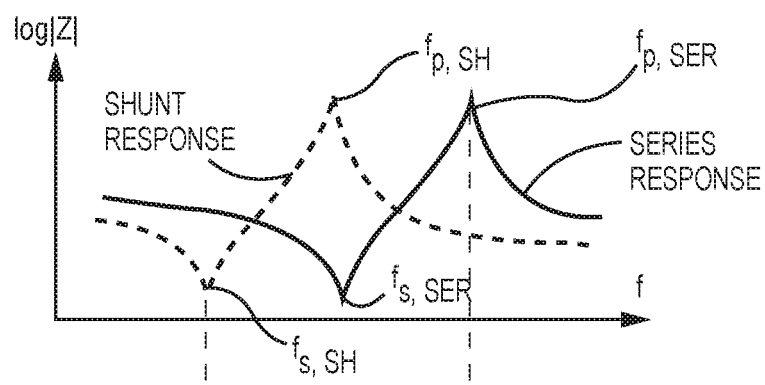

As noted above, BAW resonators 10 are often used in filter networks that operate at high frequencies and require high Q values. A basic ladder network 50 is illustrated in FIG. 8A. The ladder network 50 includes two series resonators $B_{SER}$, which are each similar to the embodiments of the BAW resonators 10 comprising the electrically isolated BO rings 30A-30D discussed above with reference to FIGS. 5A-5D, and two shunt resonators $B_{SH}$ that are arranged in a traditional ladder configuration. Typically, the series resonators $B_{SER}$ have the same or similar first frequency response, and the shunt resonators $B_{SH}$ have the same or similar second frequency response, which is different than the first frequency response, as shown in FIG. 8B. In many applications, the shunt resonators $B_{SH}$ are a detuned version of the series resonators $B_{SER}$. As a result, the frequency responses for the series resonators $B_{SER}$ and the shunt resonators $B_{SH}$ are generally very similar, yet shifted relative to one another such that the parallel resonance frequency $(f_{P,SH})$, of the shunt resonators approximates the series resonance frequency $(f_{S,SER})$, of the series resonators $B_{SER}$. Note that the series resonance frequency $(f_{S,SH})$ of the shunt resonators $B_{SH}$ is less than the series resonance frequency $(f_{S,SER})$ of the series resonators $B_{SER}$. The parallel resonance frequency $(f_{P,SH})$ of the shunt resonators $B_{SH}$ is less than the parallel resonance frequency $(f_{S,SER})$ of the series resonators $B_{SER}$.

Figure 8C:
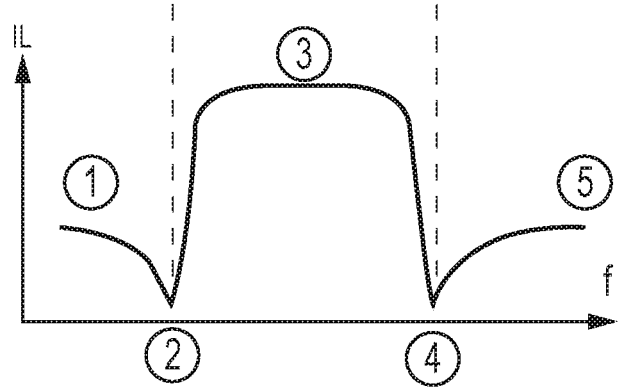

FIG. 8C is associated with FIG. 8B and illustrates the response of the ladder network 50. The series resonance frequency $(f_{S,SH})$ of the shunt resonators $B_{SH}$ corresponds to the low side of the passband's skirt (phase 2), and the parallel resonance frequency $(f_{S,SER})$ of the series resonators $B_{SER}$ corresponds to the high side of the passband's skirt (phase 4). The substantially aligned series resonance frequency $(f_{S,SER})$ of the series resonators $B_{SER}$ and the parallel resonance frequency $(f_{P,SH})$ of the shunt resonators $B_{SH}$ fall within the passband. FIGS. 9A-9E provide circuit equivalents for the five phases of the response of the ladder network 50. During the first phase (phase 1, FIGS. 8C, 9B), the ladder network 50 functions to attenuate the input signal. As the series resonance frequency $(f_{S,SH})$ of the shunt resonators $B_{SH}$ is approached, the impedance of the shunt resonators $B_{SH}$ drops precipitously, such that the shunt resonators $B_{SH}$ essentially provide a short to ground at the series resonance frequency $(f_{S,SH})$ of the shunt resonators (phase 2, FIGS. 8C, 9B). At the series resonance frequency $(f_{S,SH})$ of the shunt resonators $B_{SH}$ (phase 2), the input signal is essentially blocked from the output of the ladder network 50.

Figure 9A:
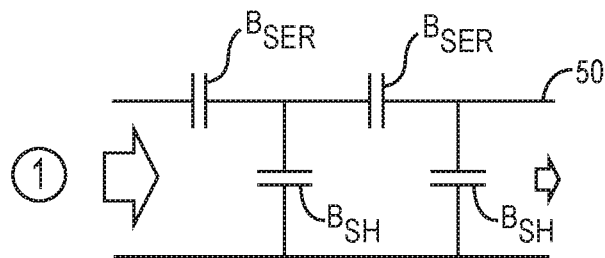
FIGS. 9A-9E are diagrams illustrating circuit equivalents for the five phases of the response of the ladder network discussed with reference to FIG. 8A.
Figure 9B:
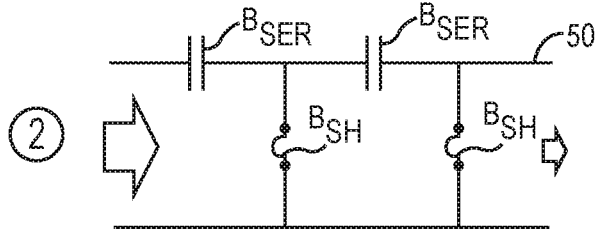
Figure 9C:
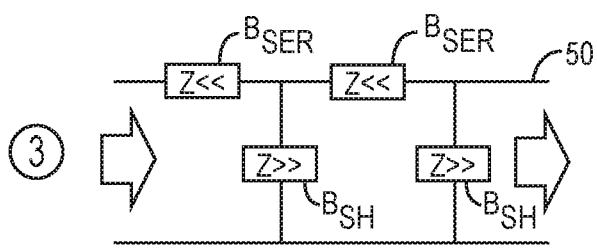
Figure 9D:
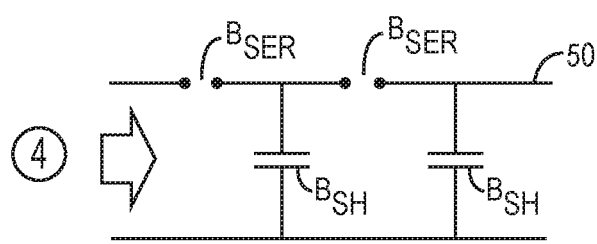
Figure 9E:
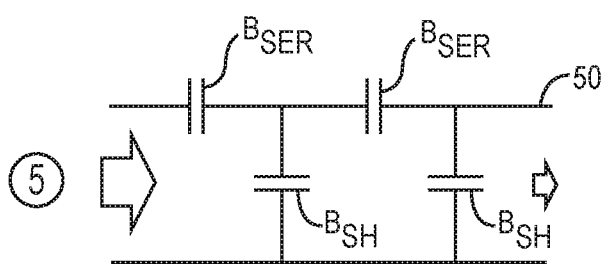

Between the series resonance frequency $(f_{S,SH})$ of the shunt resonators $B_{SH}$ and the parallel resonance frequency $(f_{P,SER})$ of the series resonators $B_{SER}$, which corresponds to the passband, the input signal is passed to the output with relatively little or no attenuation (phase 3, FIGS. 8C, 9C). Within the passband, the series resonators $B_{SER}$ present relatively low impedance, while the shunt resonators $B_{SH}$ present a relatively high impedance, wherein the combination of the two leads to a flat passband with steep low and high-side skirts. As the parallel resonance frequency $(f_{S,SER})$ of the series resonators $B_{SER}$ is approached, the impedance of the series resonators $B_{SER}$ becomes very high, such that the series resonators $B_{SER}$ essentially present themselves as an open circuit at the parallel resonance frequency $(f_{P,SER})$ of the series resonators (phase 4, FIGS. 8C, 9D). At the parallel resonance frequency $(f_{P,SER})$ of the series resonators $B_{SER}$ (phase 4), the input signal is again essentially blocked from the output of the ladder network 50. During the final phase (phase 5, FIGS. 8C, 9E), the ladder network 50 functions to attenuate the input signal, in a similar fashion to that provided in phase 1. As the parallel resonance frequency $(f_{P,SER})$ of the series resonators $B_{SER}$ is passed, the impedance of the series resonators $B_{SER}$ decreases, and the impedance of the shunt resonators $B_{SH}$ normalize. Thus, the ladder network 50 functions to provide a high Q passband between the series resonance frequency $(f_{S,SH})$ of the shunt resonators $B_{SH}$ and the parallel resonance frequency $(f_{P,SER})$ of the series resonators $B_{SER}$. The ladder network 50 provides extremely high attenuation at both the series resonance frequency $(f_{S,SH})$ of the shunt resonators $B_{SH}$ and the parallel resonance frequency $(f_{P,SER})$ of the series resonators. The ladder network 50 provides good attenuation below the series resonance frequency $(f_{S,SH})$ of the shunt resonators $B_{SH}$ and above the parallel resonance frequency $(f_{P,SER})$ of the series resonators $B_{SER}$.

When BAW resonators, such as the BAW resonator 10 discussed above with reference to FIG. 4, are utilized as a series resonator $B_{SER}$ in the ladder network 50, the optimum width of the BO ring 30 is associated with a strong BO mode below the series resonance frequency $(f_s)$. A strong BO mode limits a conventional series resonator $B_{SER}$ to having a narrow BO region 32 to avoid the presence of the strong BO mode in the filter bandpass, which results in a lower Q factor and spurious modes in the upper side of the filter bandpass.

The embodiments of the electrically isolated BO rings 30A-30D provide complete or substantially complete suppression of the spurious modes above the series resonance frequency $(f_s)$ and no associated BO mode below the series resonance frequency $(f_s)$, as evidenced by the phase curve in FIG. 6. As such, a ladder network utilizing a series BAW resonator with one of the electrically isolated BO rings 30A-30D discussed with reference to FIGS. 5A-5D will have a higher Q factor than a conventional ladder network 50 utilizing the conventional series BAW resonator $B_{SER}$ with the conventional BO ring 30. In addition, a BAW resonator 10 or a FBAR 40 comprising the electrically isolated BO rings 30A, 30C, and 30D have higher coupling coefficients due to lower parasitic capacitances (as long as the conductive portion of the BO rings is electrically floating), while the BAW resonator 10 or the FBAR 40 comprising the electrically isolated BO rings 30B has a lower coupling coefficient with no electrical excitement of the piezoelectric layer 18 in the BO region 32 (as long as the conductive portion of the BO rings are grounded), compared to that of a BAW resonator 10 or a FBAR 40 with a conventional BO ring 30.

With reference to FIGS. 10A-10E, FIGS. 10A-10E are diagrams illustrating methods for fabricating a BAW resonator, such as the BAW resonator 10 or the FBAR 40, with the electrically isolated BO rings 30A-30D discussed with reference to FIGS. 5A-5D. At least in the embodiment illustrated in FIG. 10A, the method includes forming the bottom electrode 22, which is formed over the reflector 14 in the SMR-BAW resonator 10 or over the support layer 42 in the FBAR 40, which are not shown in FIG. 10A, but are shown in FIGS. 4 and 7, respectively. The piezoelectric layer 18 is formed over the bottom electrode 22 and the top electrode 20 is formed over an inner portion of the top surface of the piezoelectric layer 18.

The bottom electrode 22, the piezoelectric layer 18, and the top electrode 20 may be formed or deposited using any deposition technique known in the art or developed in the future. Example deposition techniques include, but are not limited to, ion beam deposition (IBD), chemical vapor deposition (CVD), physical vapor deposition (PVD), molecular beam epitaxy (MBE), electrochemical deposition (ECD), and/or the like deposition techniques.

Figure 10A:
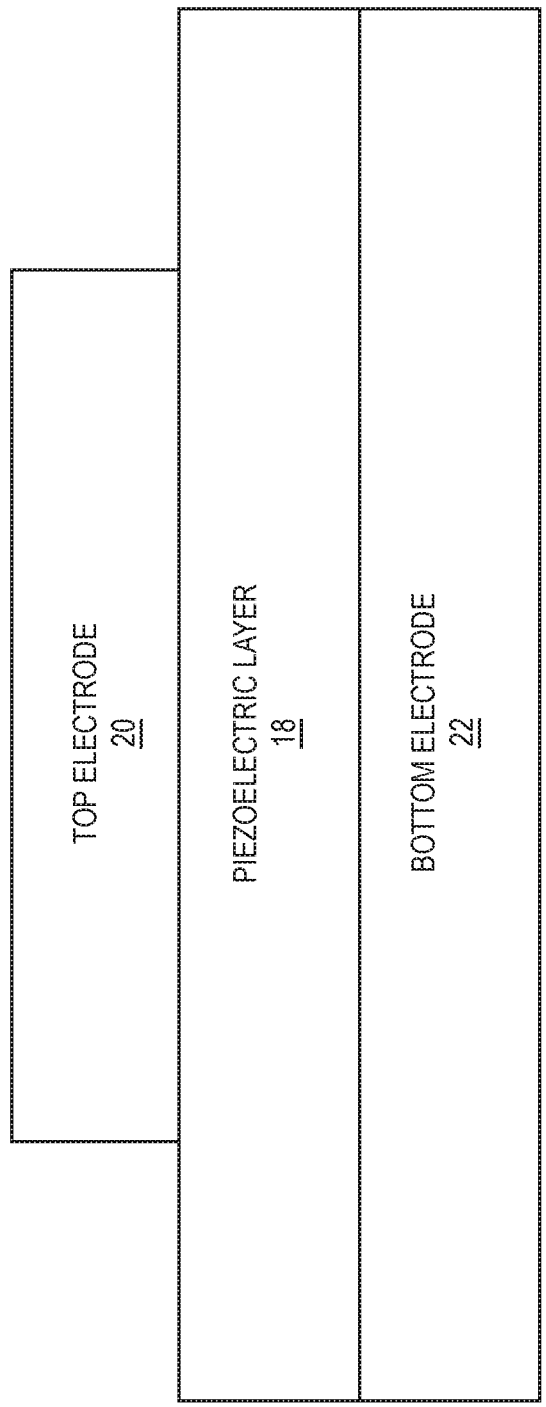
FIGS. 10A-10E are diagrams illustrating methods for fabricating a BAW resonator with the electrically isolated BO rings discussed with reference to FIGS. 5A-5D.
Figure 10B:
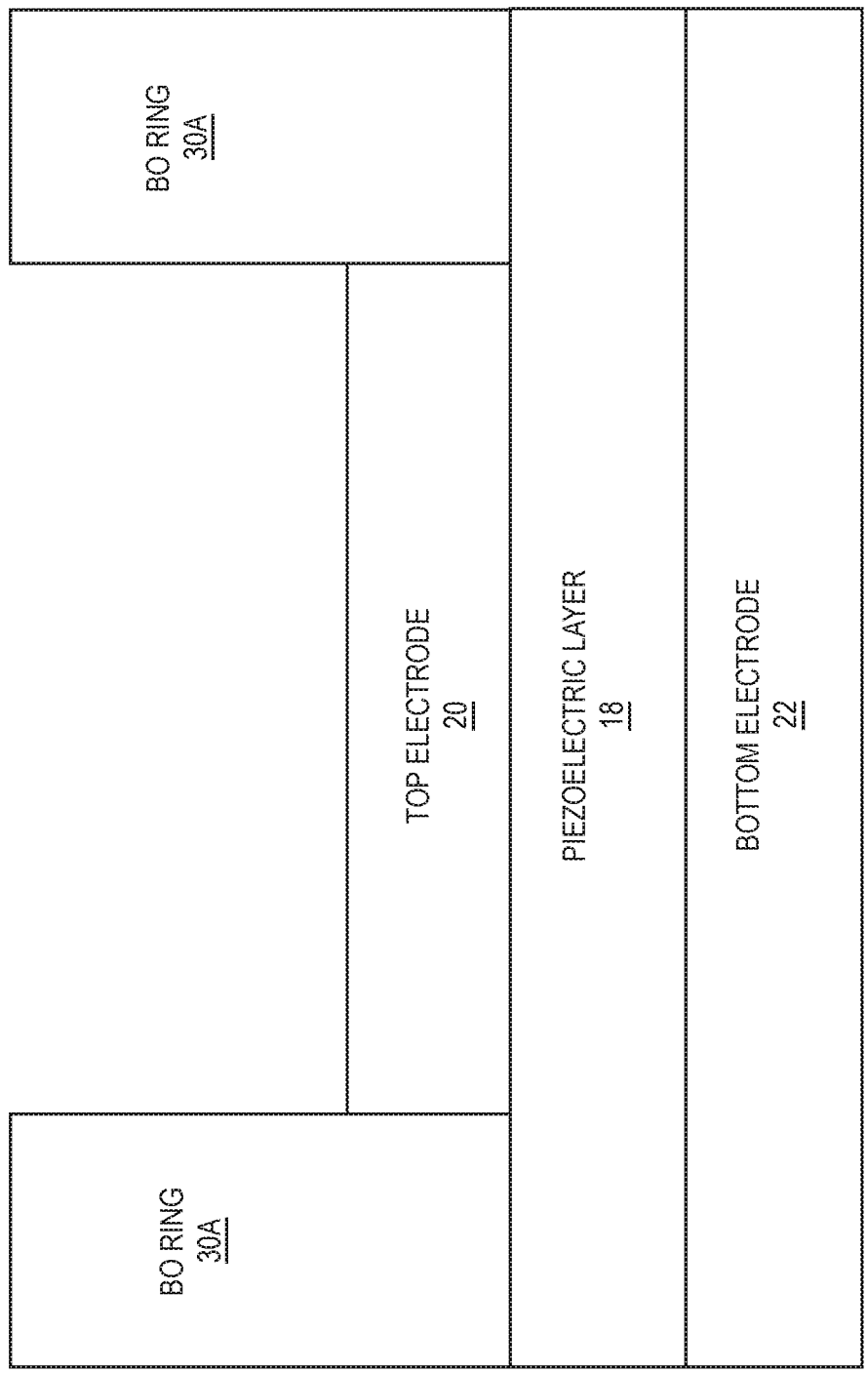

The electrically isolated BO ring 30A is formed or deposited over a portion of the top surface of the piezoelectric layer 18 that is about or surrounds the top electrode 20, as illustrated in FIG. 10B. The electrically isolated BO ring 30A and the top electrode 20 may each be deposited such that the BO ring 30A and the top electrode 20 have the dimensions, materials, and/or are tuned consistent with the discussion of the BO ring 30A and the top electrode 20 with reference to FIG. 5A.

The electrically isolated BO ring 30A may be formed or deposited using any deposition technique known in the art or developed in the future. Example deposition techniques include, but are not limited to, IBD, CVD, PVD, MBE, ECD, and/or the like deposition techniques.

Figure 10C:
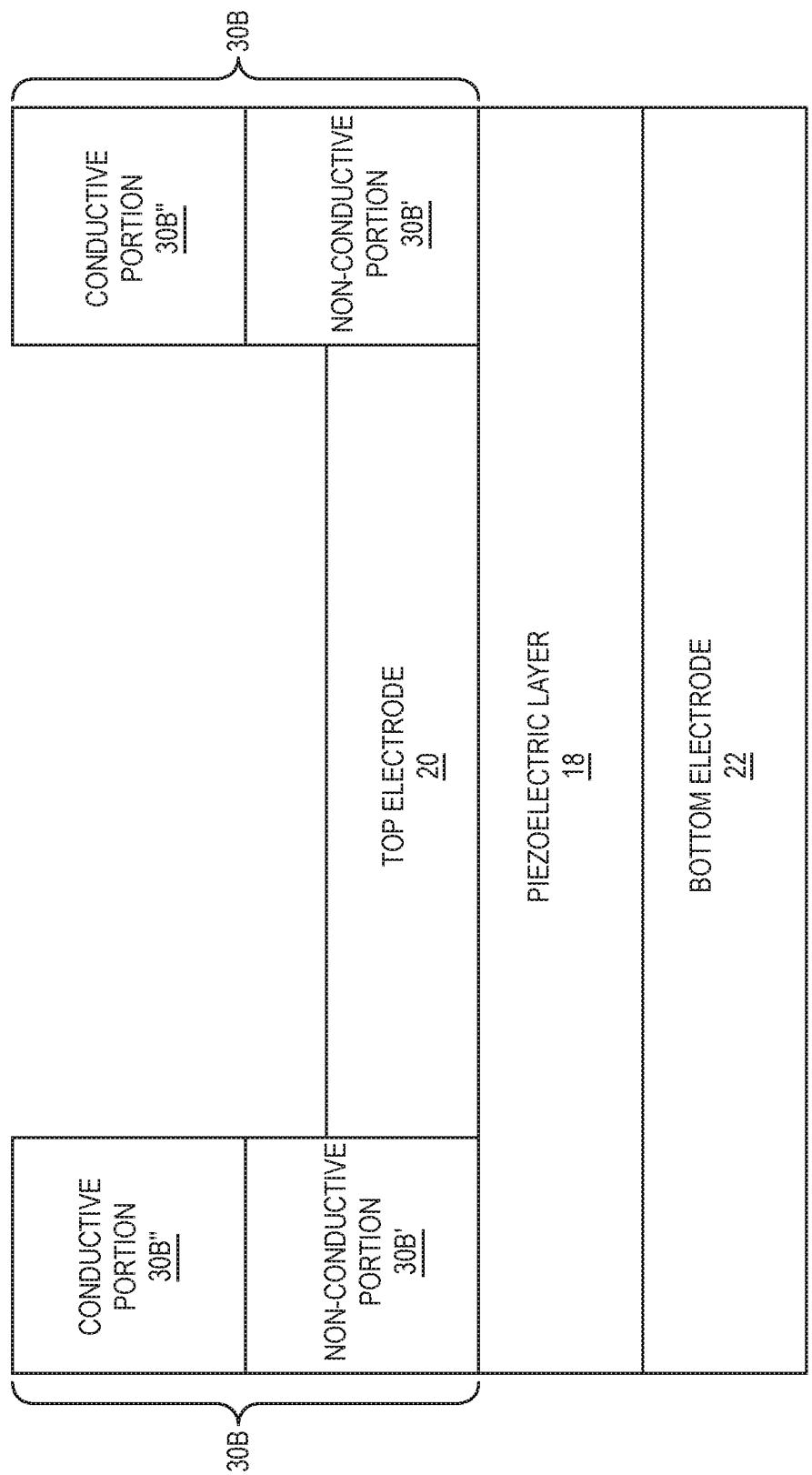

The electrically isolated BO ring 30B is formed or deposited over a portion of the top surface of the piezoelectric layer 18 that is about or surrounds the top electrode 20, as illustrated in FIG. 10C. Specifically, the non-conductive portion 30B' of the electrically isolated BO ring 30B is formed or deposited over the top surface of the piezoelectric layer 18 and the conductive portion 30B" of the electrically isolated BO ring 30B is formed/deposited over the non-conductive portion 30B'. The non-conductive portion 30B', the conductive portion 30B", and the top electrode 20 may each be deposited such that the non-conductive portion 30B', the conductive portion 30B", and the top electrode 20 have the dimensions, materials, and/or are tuned consistent with the discussion of non-conductive portion 30B', the conductive portion 30B", and the top electrode 20 with reference to FIG. 5B.

The non-conductive portion 30B' and the conductive portion 30B" may each be formed or deposited using any deposition technique known in the art or developed in the future. Example deposition techniques include, but are not limited to, IBD, CVD, PVD, MBE, ECD, and/or the like deposition techniques.

Figure 10D:
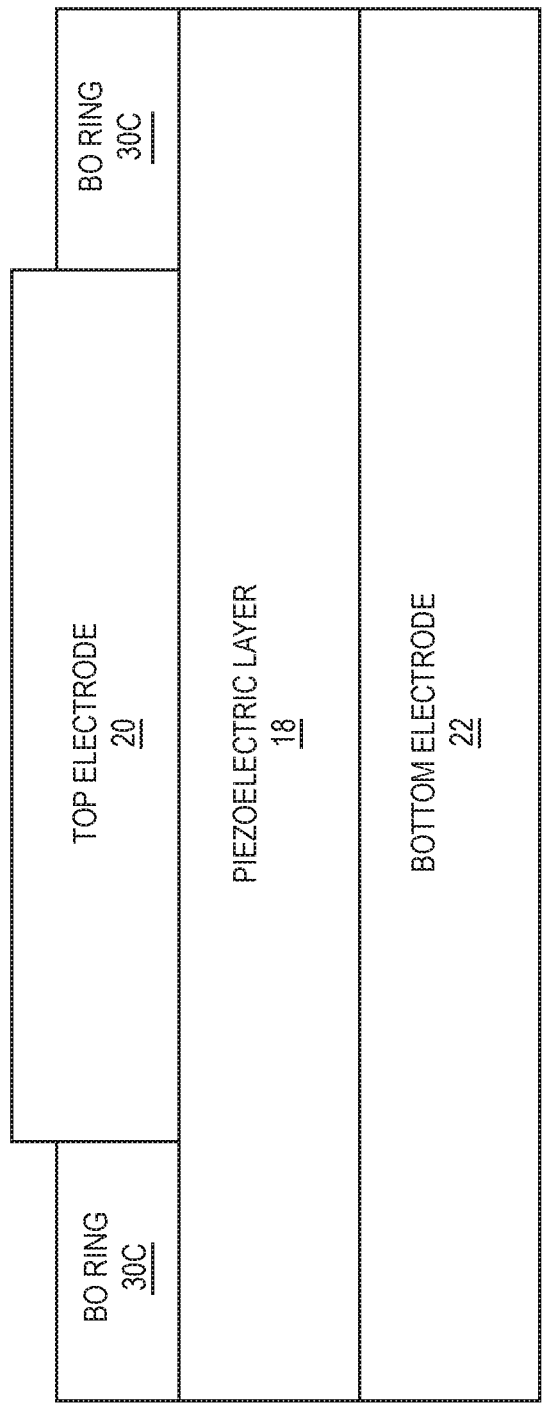

The electrically isolated BO ring 30C is formed or deposited over a portion of the top surface of the piezoelectric layer 18 that is about or surrounds the top electrode 20, as illustrated in FIG. 10D. The electrically isolated BO ring 30C and the top electrode 20 may each be deposited such that the BO ring 30C and the top electrode 20 have the dimensions, materials, and/or are tuned consistent with the discussion of the BO ring 30C and the top electrode 20 with reference to FIG. 5C.

The electrically isolated BO ring 30C may be formed or deposited using any deposition technique known in the art or developed in the future. Example deposition techniques include, but are not limited to, IBD, CVD, PVD, MBE, ECD, and/or the like deposition techniques.

Figure 10E:
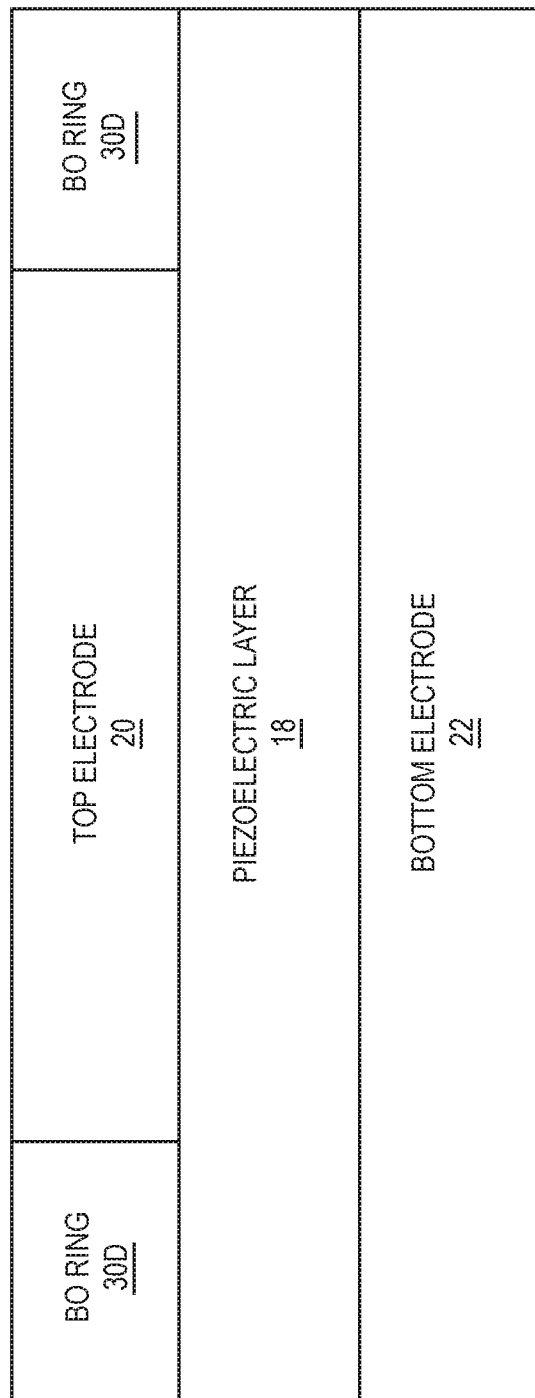

The electrically isolated BO ring 30D is formed or deposited over a portion of the top surface of the piezoelectric layer 18 that is about or surrounds the top electrode 20, as illustrated in FIG. 10E. The electrically isolated BO ring 30D and the top electrode 20 may each be deposited such that the BO ring 30D and the top electrode 20 have the dimensions and/or materials consistent with the discussion of the BO ring 30D and the top electrode 20 with reference to FIG. 5D.

The electrically isolated BO ring 30D may be formed or deposited using any deposition technique known in the art or developed in the future. Example deposition techniques include, but are not limited to, IBD, CVD, PVD, MBE, ECD, and/or the like deposition techniques.

The diagrams in the above figures illustrate the architecture, structure, topology, functionality, and operation of possible implementations of systems, devices, and methods according to various embodiments. In this regard, each diagram may represent a module or segment and that, in some alternative implementations, the function and/or order noted in the diagrams may occur out of the order presented in the figures. For example, two figures shown in succession may, in fact, be performed concurrently, or the figures may sometimes be performed in the reverse order, depending upon the functionality involved. It will also be noted that each diagram and/or illustration can be fabricated by special purpose systems and/or devices that perform the specified functions or acts.

Although the various embodiments have been described with respect to particular aspects, such aspects are for illustrative purposes only and should not be considered to limit the various embodiments. Various alternatives and changes will be apparent to those of ordinary skill in the art upon reading this application.

Those skilled in the art will also recognize improvements and modifications to the preferred embodiments of the present disclosure. All such improvements and modifications are considered within the scope of the concepts disclosed herein and the claims that follow.

What is claimed is:

1. A Bulk Acoustic Wave (BAW) resonator comprising:
a bottom electrode;
a piezoelectric layer over the bottom electrode and having a top surface with a first portion and second portion about the first portion;
a top electrode over the first portion of the piezoelectric layer; and
a border (BO) ring comprising a non-conductive portion and a conductive portion, wherein the BO ring is over the second portion of the piezoelectric layer and adjacent to the piezoelectric layer, wherein the BO ring comprises a width in a range of 0.25 microns (µm) to 10 µm and a height in a range of 200 nanometers (nm) to 450 nm from the piezoelectric layer, and the non-conductive portion is thicker than the top electrode;
wherein a width of the non-conductive portion is the same as a width of the conductive portion and wherein the top electrode is narrower than the bottom electrode such that the bottom electrode laterally overlaps with the BO ring on opposing sides of the piezoelectric layer.

2. The BAW resonator of claim 1 wherein the piezoelectric layer and the non-conductive portion are a same material.

3. The BAW resonator of claim 1 wherein the non-conductive portion comprises at least one of aluminum nitride, silicon dioxide, and silicon nitride.

4. The BAW resonator of claim 1 wherein the conductive portion is over the non-conductive portion.

5. The BAW resonator of claim 4 wherein the piezoelectric layer and the non-conductive portion are a same material.

6. The BAW resonator of claim 1 wherein the conductive portion and the top electrode are a same material.

7. The BAW resonator of claim 1 wherein:
the piezoelectric layer and the non-conductive portion are a same material; and
the conductive portion and the top electrode are a same material.

8. The BAW resonator of claim 1 wherein the non-conductive portion is thicker than the conductive portion.

9. The BAW resonator of claim 1 wherein the conductive portion is electrically isolated from the top electrode.

10. The BAW resonator of claim 1 wherein the BO ring is thicker than the top electrode by 10 nm to 50 nm.

11. The BAW resonator of claim 1 wherein the BO ring is thicker than the top electrode by 100 nm to 150 nm.

12. The BAW resonator of claim 1 wherein the conductive portion has a height in the range of 10 nm to 50 nm.

13. The BAW resonator of claim 1 wherein the width and the height of the BO ring comprise an inverse relationship with one another and are configured to suppress spurious modes.

14. The BAW resonator of claim 1 wherein the bottom electrode has a same width as a combined width of the top electrode and the BO ring.

15. The BAW resonator of claim 1 wherein the BAW resonator resonates at a series resonant frequency ($f_s$) and has no BO mode below the series resonant frequency ($f_s$).

16. The BAW resonator of claim 1 further comprising:
a substrate; and
a reflector over the substrate, wherein the bottom electrode is over the reflector to define a Solidly Mounted BAW (SMR-BAW) resonator.

17. The BAW resonator of claim 1 further comprising:
a substrate having an air cavity; and
a support layer over the substrate, wherein:
the bottom electrode is over the support layer, and
the air cavity is below an active region to define a Film BAW Resonator (FBAR).

18. A radio frequency (RF) filter comprising:
an input;
an output;
at least one shunt Bulk Acoustic Wave (BAW) resonator coupled to the input and the output; and
at least one series BAW resonator coupled to the shunt BAW resonator, the input, and the output in a ladder network configuration, each series BAW resonator comprising:
a bottom electrode;
a piezoelectric layer over the bottom electrode and having a top surface with a first portion and second portion about the first portion;
a top electrode over the first portion of the piezoelectric layer; and
a border (BO) ring comprising a non-conductive portion and a conductive portion, wherein the BO ring is over the second portion of the piezoelectric layer and adjacent to the piezoelectric layer, wherein the BO ring comprises a width in a range of 0.25 microns (µm) to 10 µm and a height in a range of 200 nanometers (nm) to 450 nm from the piezoelectric layer, and the non-conductive portion is thicker than the top electrode;
wherein a width of the non-conductive portion is the same as a width of the conductive portion and wherein the top electrode is narrower than the bottom electrode such that the bottom electrode laterally overlaps with the BO ring on opposing sides of the piezoelectric layer.

19. The BAW resonator of claim 18 wherein the non-conductive portion comprises at least one of aluminum nitride, silicon dioxide, and silicon nitride.

20. A method of fabricating a Bulk Acoustic Wave (BAW) resonator comprising:
forming a bottom electrode;
forming a piezoelectric layer having a top surface with a first portion and second portion about the first portion over the bottom electrode;
forming a top electrode over the first portion of the piezoelectric layer; and
forming a border (BO) ring having a non-conductive portion and a conductive portion, wherein the BO ring is over the second portion of the piezoelectric layer and adjacent to the piezoelectric layer, wherein the BO ring comprises a width in a range of 0.25 microns (µm) to 10 µm and a height in a range of 200 nanometers (nm) to 450 nm from the piezoelectric layer, and the non-conductive portion is thicker than the top electrode;
wherein a width of the non-conductive portion is the same as a width of the conductive portion and wherein the top electrode is narrower than the bottom electrode such that the bottom electrode laterally overlaps with the BO ring on opposing sides of the piezoelectric layer.

21. The method of claim 20 further comprising forming the conductive portion over the non-conductive portion of the BO ring, wherein the conductive portion is electrically isolated from the top electrode.

22. The method of claim 20 wherein the non-conductive portion comprises at least one of aluminum nitride, silicon dioxide, and silicon nitride.

* * * * *